(12) United States Patent
Miyagi et al.

(10) Patent No.: US 8,004,053 B2
(45) Date of Patent: Aug. 23, 2011

(54) MICROMECHANICAL DEVICE AND METHOD OF MANUFACTURING MICROMECHANICAL DEVICE

(75) Inventors: Takeshi Miyagi, Fujisawa (JP);
Michinobu Inoue, Yokohama (JP);
Susumu Obata, Yokohama (JP);
Yoshiaki Sugizaki, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 433 days.

(21) Appl. No.: 12/255,144

(22) Filed: Oct. 21, 2008

(65) Prior Publication Data

US 2009/0101383 A1    Apr. 23, 2009

(30) Foreign Application Priority Data

Oct. 22, 2007  (JP) ................................. 2007-274291
Sep. 5, 2008   (JP) ................................. 2008-227997

(51) Int. Cl.
*H01L 29/84* (2006.01)
(52) U.S. Cl. . 257/417; 257/418; 257/419; 257/E23.181; 257/E23.182
(58) Field of Classification Search .................. 257/417, 257/418, 419, E23.181, E23.182
See application file for complete search history.

(56) References Cited

U.S. PATENT DOCUMENTS

| 7,008,812 | B1 | 3/2006 | Carley |
| 7,145,213 | B1 | 12/2006 | Ebel et al. |
| 2003/0183916 | A1 | 10/2003 | Heck et al. |
| 2006/0108675 | A1* | 5/2006 | Colgan et al. ............... 257/684 |
| 2006/0246490 | A1* | 11/2006 | Anderson et al. ............. 435/6 |
| 2008/0160679 | A1* | 7/2008 | Colgan et al. ............... 438/127 |
| 2008/0211076 | A1 | 9/2008 | Nishiuchi et al. |
| 2008/0297992 | A1 | 12/2008 | Obata et al. |
| 2009/0071807 | A1 | 3/2009 | Kominato et al. |
| 2009/0134513 | A1* | 5/2009 | Qiu ............................. 257/734 |
| 2009/0291264 | A1* | 11/2009 | Akai et al. ................... 428/172 |

FOREIGN PATENT DOCUMENTS

| CN | 1689166 A | 10/2005 |
| JP | 2005-207959 | 8/2005 |
| KR | 10-2006-0015633 | 2/2006 |

OTHER PUBLICATIONS

U.S. Appl. No. 12/358,869, filed Jan. 23, 2009, Kojima, et al.
Susumu Obata, et al., "In-Line Wafer Level Hermetic Packages for MEMS Variable Capacitor", IEEE ECTE (Electronic Components and Technology Conference), 2008, pp. 158-163.

(Continued)

*Primary Examiner* — Ngan Ngo
(74) *Attorney, Agent, or Firm* — Oblon, Spivak, McClelland, Maier & Neustadt, L.L.P.

(57) ABSTRACT

A micromechanical device according to an aspect of the present invention includes, a substrate, a micromachine which is mounted on the substrate, is provided with a mechanism deformed by a function of an electric field, and changes the electrical characteristics concomitantly with the deformation, an inner inorganic sealing film which contains an inorganic material, is provided on a principal surface of the substrate, covers the micromachine through a hollow section containing a gaseous body therein, and is provided with opening shape sections allowing the hollow section to communicate with the outside, an organic sealing film which contains an organic material, is formed on the inner inorganic sealing film, and blocks up the opening shape sections, and an outer inorganic sealing film which contains an inorganic material with lower moisture permeability than the organic material, is formed on the organic sealing film, and covers the organic sealing film.

9 Claims, 8 Drawing Sheets

OTHER PUBLICATIONS

Korean Office Action issued Oct. 11, 2010, in Patent Application No. 10-2008-0103484 (with English-language translation).
Chinese Office Action issued Oct. 11, 2010, in Patent Application No. 200810170096.0 (with English-language translation).
David I. Forehand, et al., "Wafer Level Micropackaging for RF MEMS Switches", Proceedings of IPACK2005, ASME Interpack '05, Jul. 17-22, 2005, pp. 1-5.

\* cited by examiner

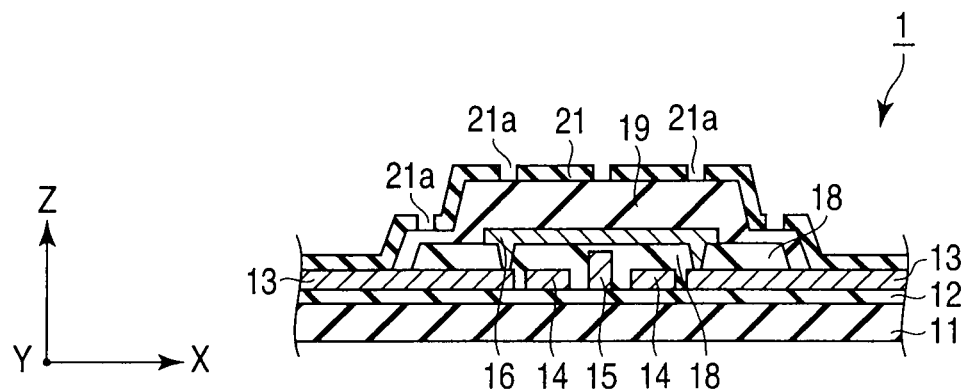
F I G. 7
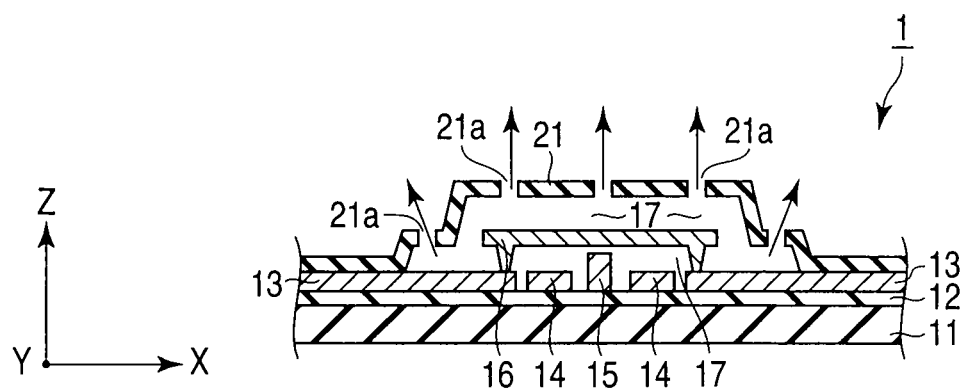
F I G. 8
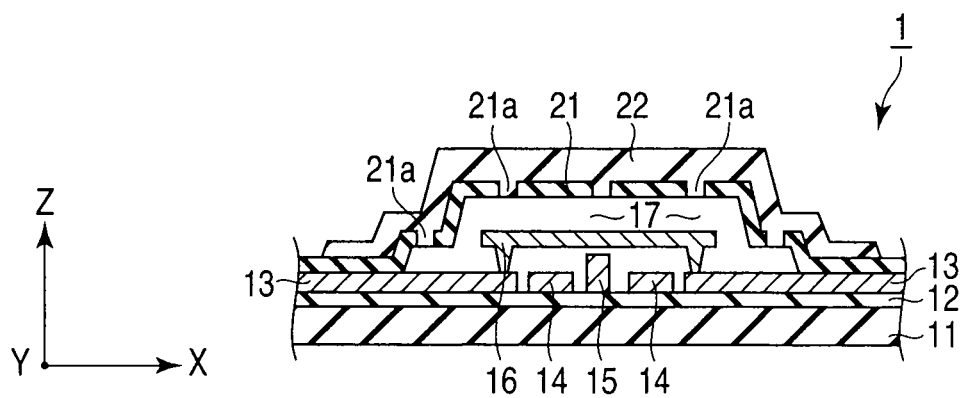
F I G. 9

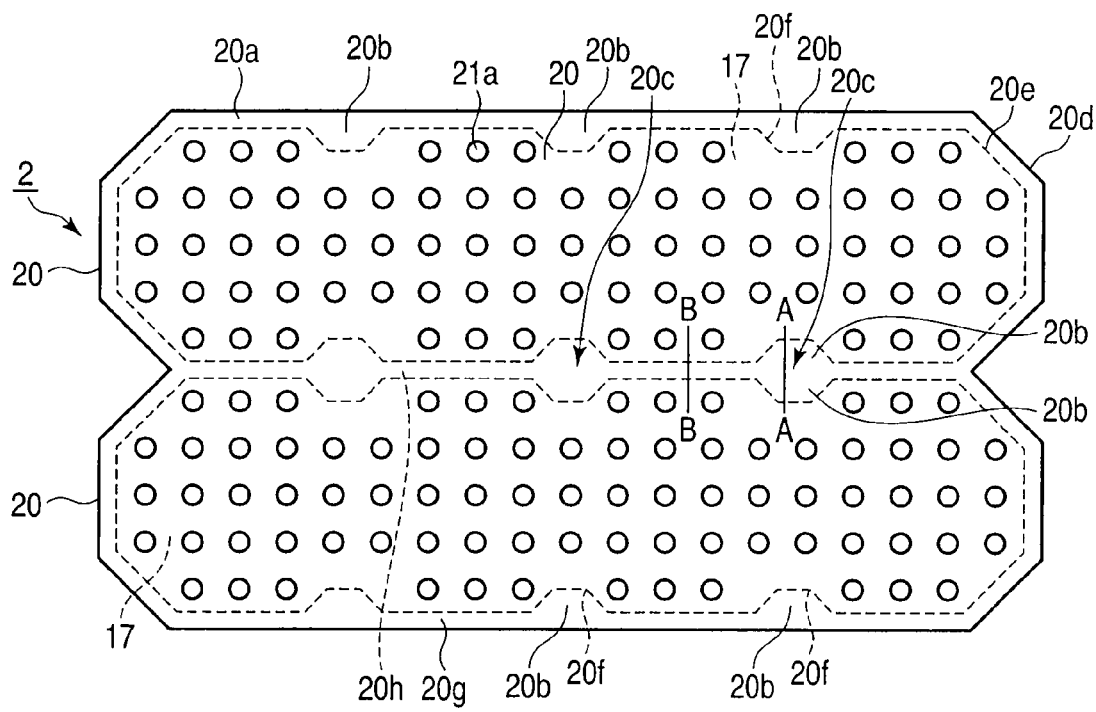
F I G. 13
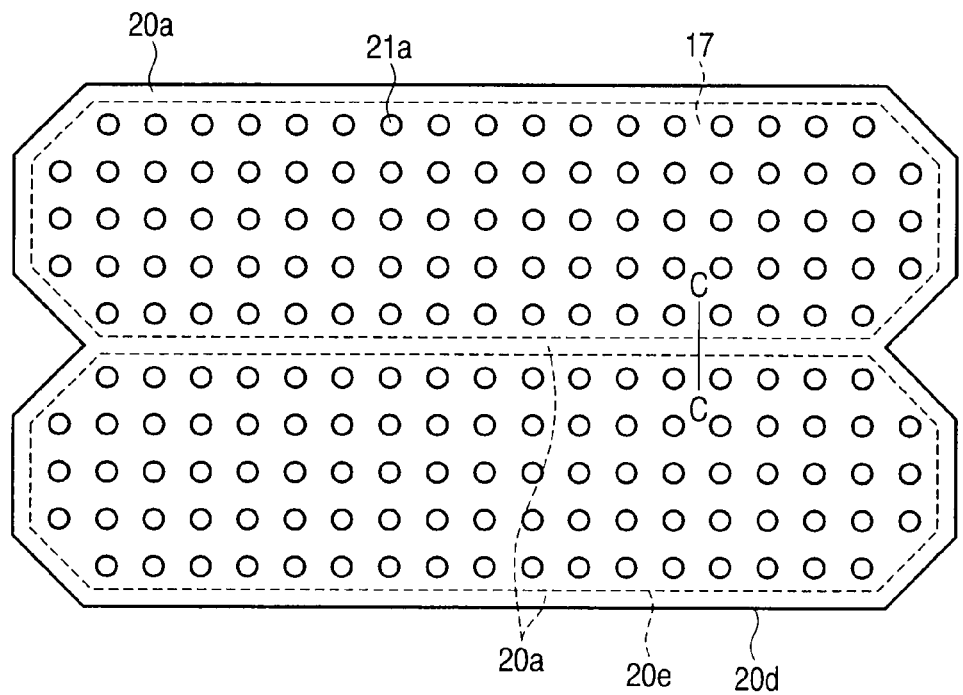
F I G. 14

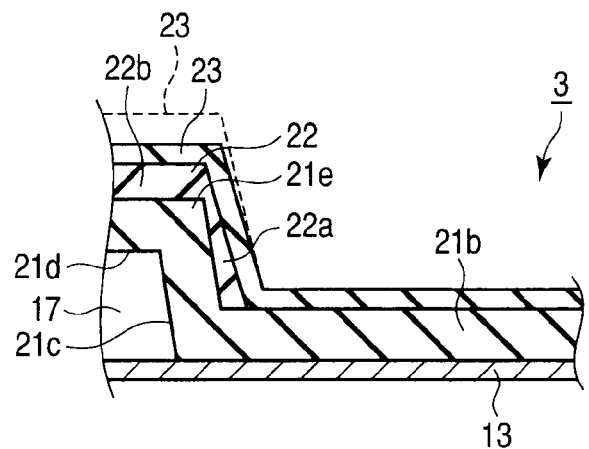
F I G. 18
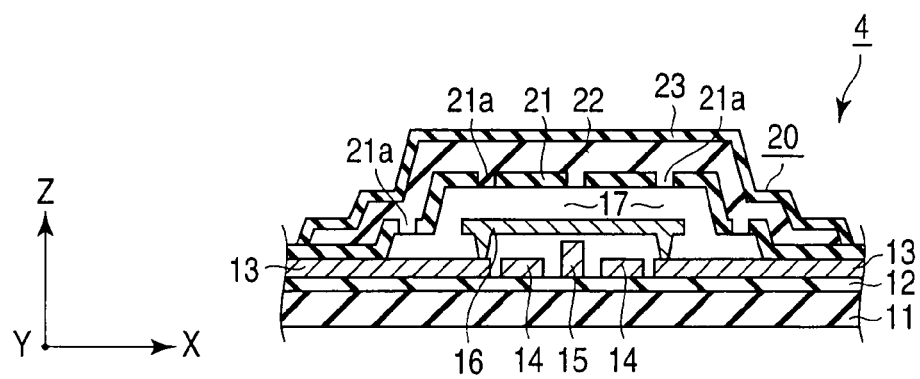
F I G. 19
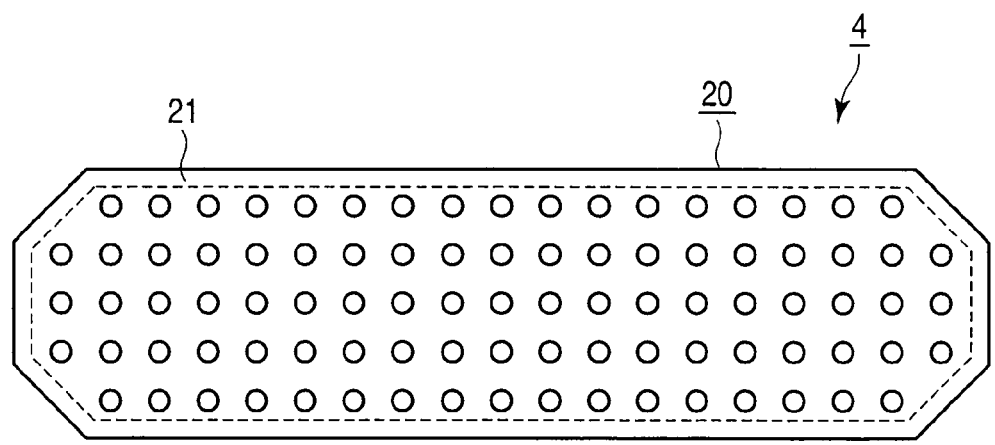
F I G. 20

MICROMECHANICAL DEVICE AND METHOD OF MANUFACTURING MICROMECHANICAL DEVICE

CROSS-REFERENCE TO RELATED APPLICATIONS

This application is based upon and claims the benefit of priority from prior Japanese Patent Applications No. 2007-274291, filed Oct. 22, 2007; and No. 2008-227997, filed Sep. 5, 2008, the entire contents of both of which are incorporated herein by reference.

BACKGROUND OF THE INVENTION

1. Field of the Invention

The present invention relates to a micromechanical device of a micromachine such as packaging of a minute electromechanical component, and a method of manufacturing a micromechanical device.

2. Description of the Related Art

As an example of a micromechanical device shown in, for example, Jpn. Pat. Appln. KOKAI Publication No. 2005-207959, and U.S. Pat. No. 7,008,812B1, a micro-electromechanical system (MEMS) 101 in which a MEMS element 104 as a micromachine having a motion is mounted on a substrate 102, and is sealed in a hollow state as shown in FIGS. 10 to 12 are known.

The MEMS 101 is constituted of a substrate 102, an insulating layer 103, a MEMS element 104, signal interconnect 105, a hollow section 106, a first sealing body 107, and a second sealing film 108. The MEMS element 104 has a cantilever or center impeller beam structure, in which the beam is formed in such a manner that a gap of several microns is held between a central part of the beam and the signal interconnect 105. In the insulating layer 103 directly under the MEMS element 104, the signal interconnect 105 is formed by using Au or the like. The MEMS element 104 is constituted of poly-Si or Al having high spring characteristics, and gets closer to the signal interconnect 105 side by being given drive force such as electrostatic force or the like. Further, when the drive force is removed, the MEMS element 104 is restored to the position in which the element 104 has a gap between itself and the signal interconnect 105 by its own spring characteristics. By changing the gap between the MEMS element 104 and the signal interconnect 105 as described above, the MEMS element 104 performs functions of variable capacitance, switching, and the like.

For the operation and protection of the MEMS element, the MEMS element needs to be sealed in a hollow state. For the purpose of reducing the manufacturing cost and the size, there is provided a method of manufacturing a micromechanical device by a film formation process. First, in order to form a gap between the micromachine and the substrate, a sacrificial layer 109 to be completely removed in the subsequent step is formed on the substrate 102. Then, a MEMS element is formed on the sacrificial layer 109. A second sacrificial layer 110 is formed on the MEMS element 104 formed on the sacrificial layer 109. An inner inorganic sealing film 107 which will become a micromechanical device is formed on the second sacrificial layer 110. Opening shape sections 107a for introducing an etching agent when the sacrificial layers 109 and 110 around the MEMS element 104 are removed during or after film formation are formed. The etching agent for removing the sacrificial layer is introduced from the opening shape sections 107a, and all the sacrificial layers 109 and 110 are completely removed. Finally, a second sealing film 108 is formed on the inner inorganic sealing film 107a until the opening shape sections 107a are completely closed.

As a result of the above, it becomes possible to seal the MEMS element 104 in a hollow state by the micro-electromechanical system 101 constituted of the first and second sealing films 107 and 108. The inside of the hollow section 106 is a reduced-pressure atmosphere.

Incidentally, here, the opening shape sections 107a are provided at a position separate from the MEMS element 104 in order that the film material may not be deposited on the MEMS element 104 because when the second sealing film 108 is formed by a film formation method such as CVD and sputtering, the film material is deposited directly under the opening shape section 107a.

However, in the technique described above, there have been the following problems. That is, when the second sealing film 108 is formed by CVD, sputtering, or the like, and the opening shape sections 107a of the inner inorganic sealing film 107 are closed, the inside of the hollow section 106 becomes the reduced atmosphere in the thin film deposition system chamber, and the sections 107a are closed in the state where the reduced-pressure state is held. In the reduced-pressure atmosphere, the fluid resistance is small, and hence when the electrostatic force applied to the MEMS element of the spring structure is removed, vibration of the MEMS element 104 becomes difficult to be statically determinate. Thus, the vibration of the MEMS element 104 causes noise included in the output signal.

On the other hand, in order to realize reduction in size, for example, when a plurality of micromechanical devices are individually sealed, and the micromechanical devices are arranged with a small pitch, the close adhesion region becomes small. Thus, when heat is applied to the devices in the assembly process after the sealing film formation, there is the possibility of the sealing body and the substrate between the sealing films, or the sealing films being peeled off each other.

The present invention has been contrived to solve the above-mentioned problems, and an object thereof is to provide a micromechanical device of a micromachine in which noise of the output signal can be reduced by making the vibration of the micromachine easily determinate.

Another object of the present invention is to prevent the sealing films of the sealing body, or the sealing body and the substrate from being peeled off each other when heat is applied to the micromechanical device in the assembly process after the sealing film formation.

BRIEF SUMMARY OF THE INVENTION

A micromechanical device according to an aspect of the present invention comprises, a substrate, a micromachine which is mounted on the substrate, is provided with a mechanism deformed by a function of an electric field, and changes the electrical characteristics concomitantly with the deformation; an inner inorganic sealing film which contains an inorganic material, is provided on a principal surface of the substrate, covers the micromachine through a hollow section containing a gaseous body therein, and is provided with opening shape sections allowing the hollow section to communicate with the outside, an organic sealing film which contains an organic material, is formed on the inner inorganic sealing film, and blocks up the opening shape sections; and an outer inorganic sealing film which contains an inorganic material with lower moisture permeability than the organic material, is formed on the organic sealing film, and covers the organic sealing film.

A method of manufacturing a micromechanical device according to another aspect of the present invention comprises, arranging a micromachine which is provided with a mechanism deformed by a function of an electric field, and changes the electrical characteristics concomitantly with the deformation, forming a sacrificial layer on the micromachine, forming an inner inorganic sealing film which contains an inorganic material, covers the micromachine through the sacrificial layer, and is provided with opening sections communicating with a hollow section to be formed; introducing a fluid for removing the sacrificial layer from the opening shape sections to remove the sacrificial layer; forming an organic sealing film constituted of an organic material to cover the opening shape sections of the inner inorganic sealing film, and forming, under reduced pressure, an outer inorganic sealing film constituted of an inorganic material with lower moisture permeability than the organic material to cover the outside of the organic sealing film.

A micromechanical device according to still another aspect of the present invention comprises, a substrate a micromachine which is mounted on the substrate, is provided with a mechanism deformed by a function of an electric field, and changes the electrical characteristics concomitantly with the deformation; an inner sealing film which is provided on a principal surface of the substrate, covers the micromachine through a hollow section containing a gaseous body therein, and is provided with opening shape sections allowing the hollow section to communicate with the outside; and an outer sealing film which is formed on the inner sealing film, and blocks up the opening shape sections, wherein a close adhesion section at which the inner sealing film surrounding an outer periphery of the micromachine, and the principal surface of the substrate closely adhere to each other includes a narrow section, and a wide section widths of which are formed wider than the narrow section.

BRIEF DESCRIPTION OF THE SEVERAL VIEWS OF THE DRAWING

The accompanying drawing, which are incorporated in and constitute a part of the specification, illustrate embodiments of the invention, and together with the detailed description of the embodiments given below, serve to explain the principles of the invention.

FIG. 7 is a cross-sectional view showing a manufacturing step of the micromechanical device.

FIG. 8 is a cross-sectional view showing a manufacturing step of the micromechanical device.

FIG. 9 is a cross-sectional view showing a manufacturing step of the micromechanical device.

FIG. 13 is a plan view of a micromechanical device according to a second embodiment of the present invention.

FIG. 14 is a plan view showing an example of a micromechanical device.

FIG. 18 is a cross-sectional view showing a state of the micromechanical device after the sealing body is deformed.

FIG. 19 is a cross-sectional view showing an example of a micromechanical device.

FIG. 20 is a plan view of the micromechanical device.

DETAILED DESCRIPTION OF THE INVENTION

Figure 1:
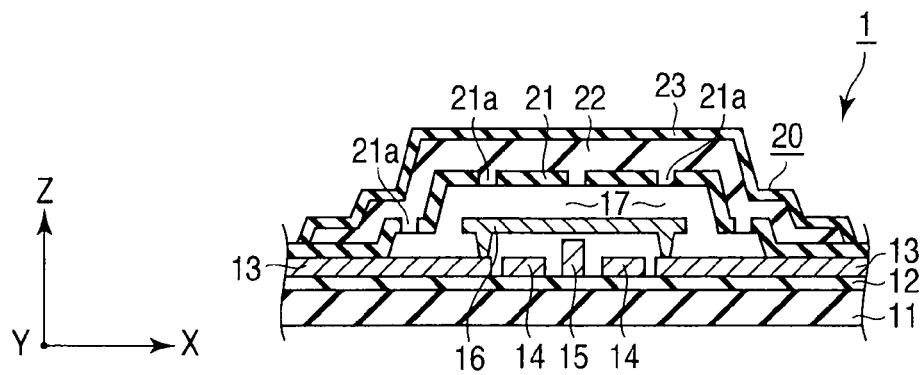
FIG. 1 is a partially cut-out perspective view showing a micromechanical device according to a first embodiment of the present invention.
Figure 2:
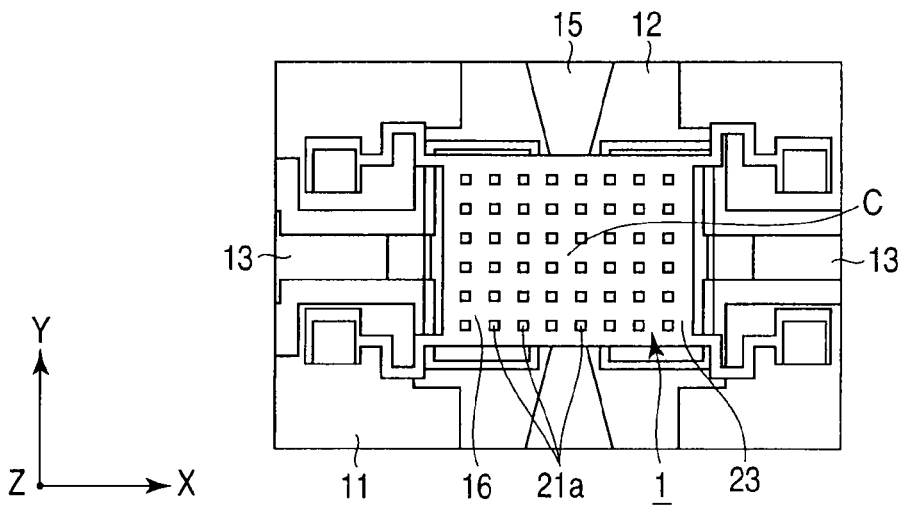
FIG. 2 is a cross-sectional view showing a manufacturing step of the micromechanical device.

A micromechanical device 1 according to a first embodiment of the present invention will be described below with reference to FIGS. 1 and 2. Incidentally, in FIGS. 1 and 2, the configuration is schematically shown by appropriately enlarging, reducing, and omitting the configuration. In FIGS. 1 and 2, X, Y, and Z indicate three directions perpendicular to each other. Incidentally, although FIG. 2 is a view of the micromechanical device 1 from above, FIG. 2 is schematically shown by solid lines for explanation.

The micromechanical device 1 is, for example, a microelectromechanical system (MEMS), and includes a base substrate 11 constituting a substrate, an insulating layer 12, a MEMS element 16 (micromachine), signal interconnect 15, and the like. Further, the micromechanical device 1 is sealed airtightly in a state where a hollow section 17 which is formed by a combination of a sealing body 20 with the substrate, and in which a gaseous atmosphere at normal pressure is sealed is formed. The sealing body 20 is constituted by stacking an inner inorganic sealing film 21 defining the hollow section 17, an organic sealing film 22, and an outer inorganic sealing film 23 one on top of the other in the order mentioned.

The base substrate 11 is a silicon (Si) substrate, a glass substrate, or a sapphire substrate, and is formed into a predetermined plate-like shape.

The insulating layer 12 is formed on the base substrate 11, and is constituted of, for example, a silicon oxide film ($SiO_2$). The substrate is constituted of the base substrate 11, and the insulating layer 12.

A lower electrode 13, a drive electrode 14, signal interconnect 15, and a MEMS element 16 are formed on the top surface of the insulating layer 12. The signal interconnect 15 is formed of Au or the like, and has a rectangular shape extending in the Y direction in FIG. 2.

The MEMS element 16 is formed on the top surface of the insulating layer 12. The MEMS element 16 is connected to the lower electrode 13 leading to the outside of the sealing body 20.

The MEMS element 16 is a movable mechanism section of the micromachine, and has a center impeller beam-like shape with a step. The central part of the beam-like shape is arranged separate from the signal interconnect 15 with a gap of about several microns held between the central part and the interconnect 15. It is possible to secure the gap structure through, for example, a manufacturing process for forming a MEMS element 16 on a sacrificial layer 18 having a thickness of about several microns as will be described later. On the surface of the insulating layer 12 directly under the MEMS element 16, the signal interconnect 15 is formed of Au or the like.

The MEMS element 16 is constituted of, for example, poly-Si, or Al, and has spring characteristics. When given drive force such as electrostatic force from the drive electrode 14 as a function of the electric field, the MEMS element 16 gets closer to the signal interconnect 15 by elastic deformation and, when the drive force is removed, returns to the original position again by its own spring characteristics. That is, the MEMS element 16 changes the electrical characteristics of the micromechanical device 1 by deforming itself in such a manner that the gap between itself and the signal interconnect 15 is changed in accordance with the drive force such as electrostatic force when the drive force is applied thereto or removed therefrom. In accordance with the way in which the electrical characteristics are changed, a function such as variable capacitance, switching, or the like is achieved.

The peripheral edge section of the inner inorganic sealing film 21 is connected to the top surface of the surrounding part of the insulating layer 12 at a position separate from the MEMS element 16, and the central section of the film 21 covers the MEMS element 16 from above through the hollow section 17. That is, the inner inorganic sealing film 21 is separate from the MEMS element 16.

The inner inorganic sealing film 21 is provided with a plurality of opening shape sections 21a which have been openings provided in the manufacturing process to introduce a dry etching gas ($O_2$ plasma or the like) for removing the sacrificial layer. The plural opening shape sections 21a are formed in the entire area of the film 21 surrounding the MEMS element 16 including an area above the MEMS element 16 at intervals of, for example, 50 μm. The outside of the inner inorganic sealing film 21 is covered with the organic sealing film 22.

On the inner inorganic sealing film 21, the organic sealing film 22 is formed. The organic sealing film 22 is constituted of a resin material, and is formed to cover the inner inorganic sealing film 21 by having a predetermined thickness. The opening shape sections 21a are blocked up by the organic sealing film 22.

Incidentally, it is desirable that the process for forming the organic sealing film 22 be performed at a low temperature, because when the temperature becomes high during the formation of the organic sealing film 22, bubbles may be generated in the organic film due to an increase in the internal pressure. Accordingly, as the resin for configuring the organic sealing film 22, a UV curing resin is suitable. When a curing reaction without heat can be expected, a resin that can be cured by light having a wavelength other than UV light may be used. On the organic sealing film 22, the outer inorganic sealing film 23 is formed.

The outer inorganic sealing film 23 is constituted of an inorganic material lower than the organic material constituting the organic sealing film 22 in water permeability such as silicon nitride (SiN), and is formed to cover the outside of the organic sealing film 22. By this outer inorganic sealing film 23, absorption or permeation of moisture is prevented. Further, when a pressurized atmosphere is present in the hollow section 17, the outer inorganic sealing film 23 serves also as a barrier for preventing an internal component from being transmitted from the hollow section to the outside.

Next, a method of manufacturing the micromechanical device 1 according to this embodiment will be described below with reference to FIGS. 1 to 9.

Figure 3:
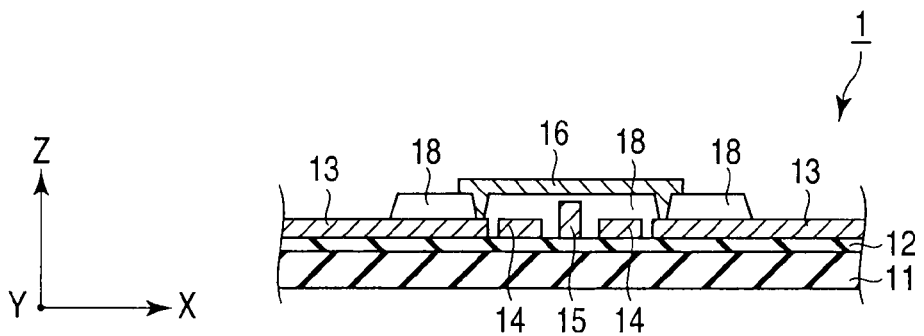
FIG. 3 is a cross-sectional view showing a manufacturing step of the micromechanical device.

First, as shown in FIG. 3, the insulating layer 12 is formed on the base substrate 11, and the signal interconnect 15 is formed on the insulating layer 12. Subsequently, an electrostatic drive high-frequency switch having a cantilever structure is formed as a MEMS element 16 by using, for example, Au as a construction material.

At this time, first, in order to secure a gap between the signal interconnect 15 and the MEMS element 16, the sacrificial layer 18 having a predetermined shape to be completely removed in the later process is formed to form a step on the signal interconnect 15 as shown in FIG. 3 and, thereafter the MEMS element 16 is formed on this sacrificial layer 18. As a result of this, the MEMS element 16 is formed into a predetermined center impeller beam-like shape having a step, and having a beam part separate from the signal interconnect 15.

Figure 4:
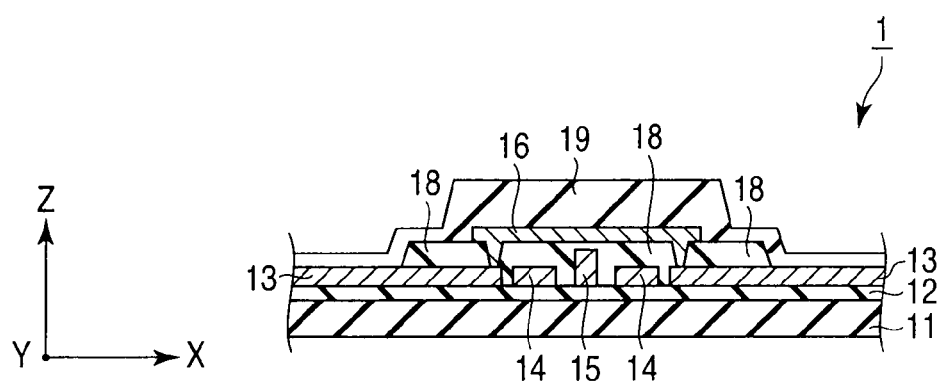
FIG. 4 is a cross-sectional view showing a manufacturing step of the micromechanical device.

Further, as shown in FIG. 4, in addition to the state where the MEMS element 16 is formed, a second sacrificial layer 19 is formed to cover the MEMS element 16.

Figure 5:
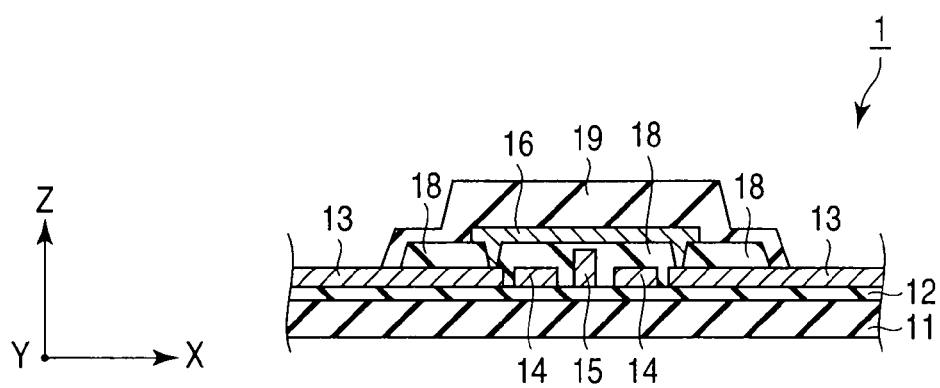
FIG. 5 is a cross-sectional view showing a manufacturing step of the micromechanical device.

As for the sacrificial layers 18 and 19, a polyimide film is formed by, for example, spin coating, then is formed into a predetermined shape by patterning as shown in FIG. 5, and is then cured, thereby constituting each of the films 18 and 19.

Figure 6:
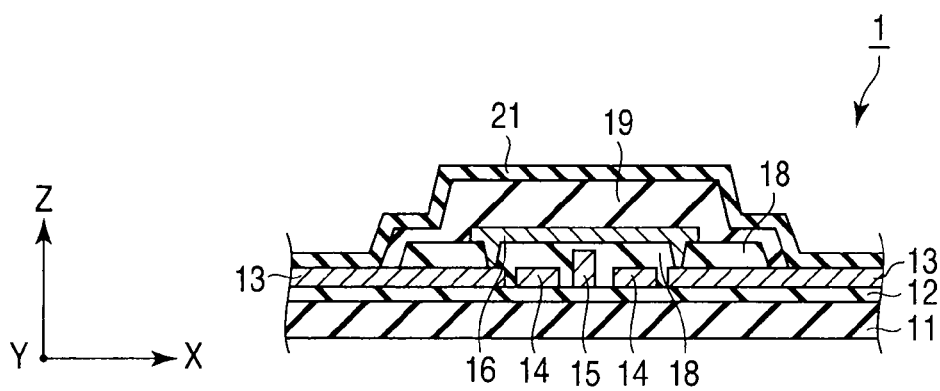
FIG. 6 is a cross-sectional view showing a manufacturing step of the micromechanical device.
Figure 10:
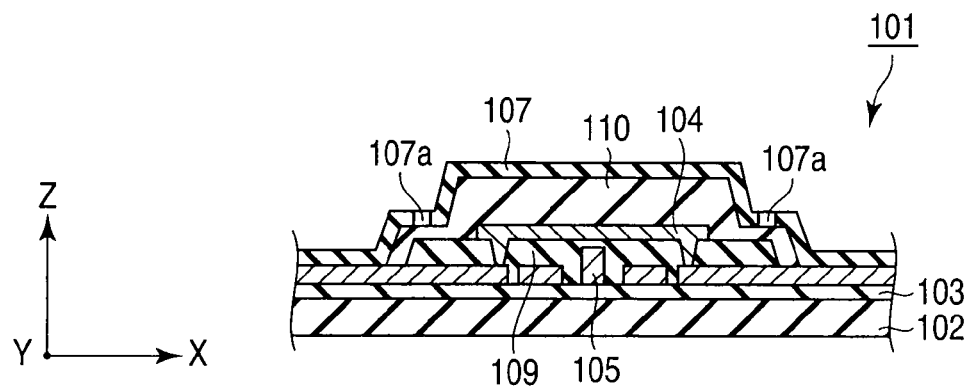
FIG. 10 is a cross-sectional view showing an example of a manufacturing step of a micromechanical device.
Figure 11:
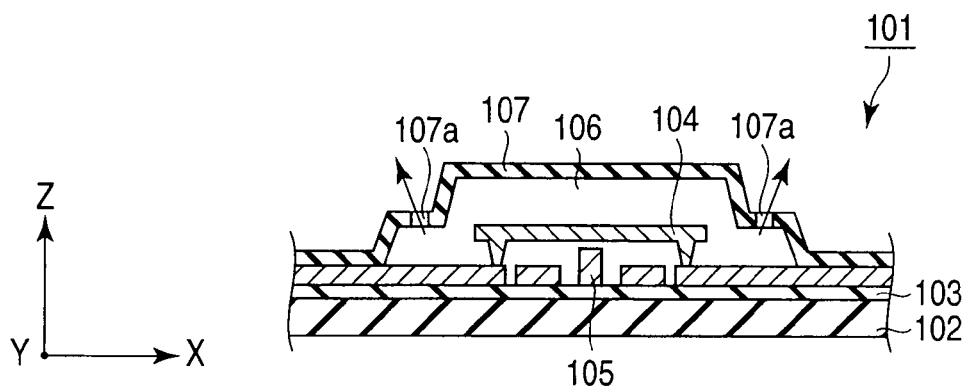
FIG. 11 is a cross-sectional view showing an example of a manufacturing step of a micromechanical device.
Figure 12:
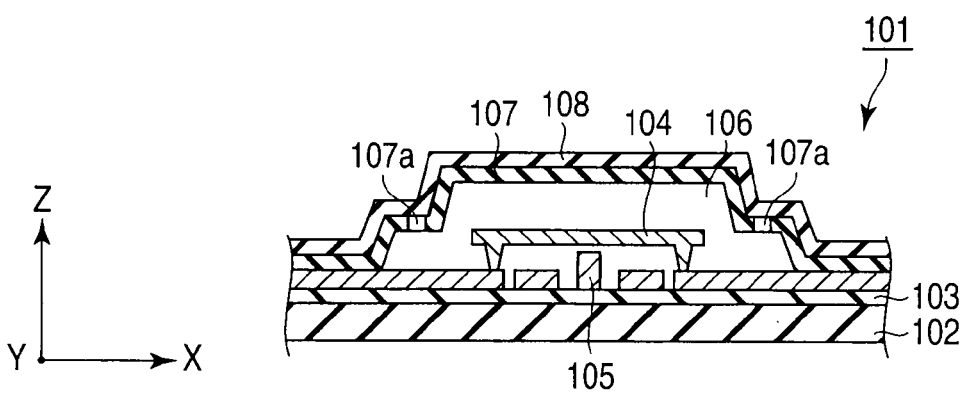
FIG. 12 is a cross-sectional view showing an example of a micromechanical device.
Figure 15:
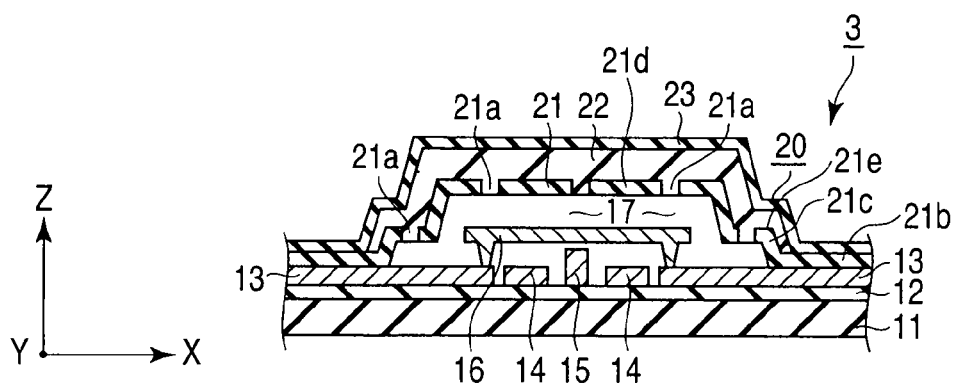
FIG. 15 is a cross-sectional view of a micromechanical device according to a third embodiment of the present invention.
Figure 16:
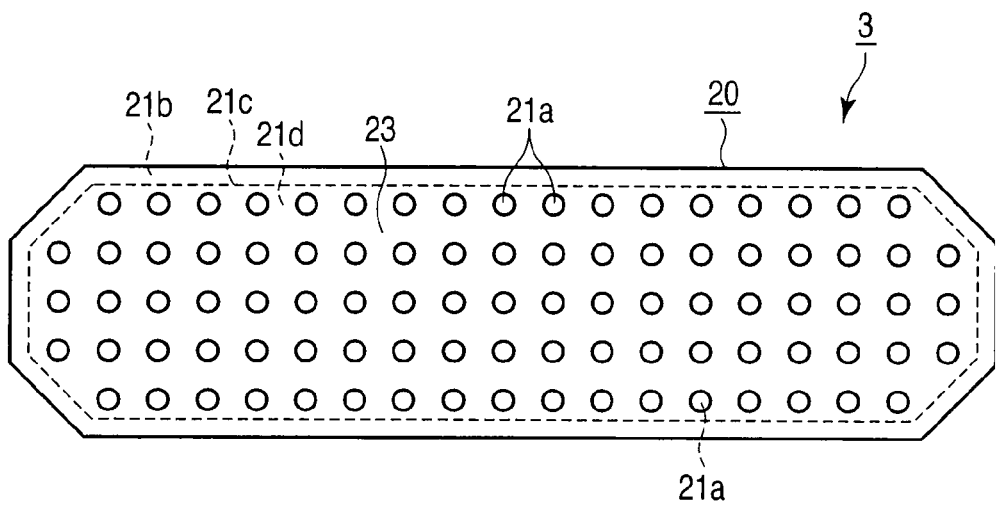
FIG. 16 is a plan view of the micromechanical device.

As shown in FIG. 6, after the formation of the sacrificial layers 18 and 19, $SiO_2$ is formed to obtain a predetermined thickness as the inner inorganic sealing film 21 by using a plasma-enhanced CVD system. The thickness of the inner inorganic sealing film 21 is, for example, about 1 μm.

Further, a plurality of opening shape sections 21a which are openings for introducing a removing agent when the sacrificial layers 18 and 19 around the MEMS element 16 are removed during or after the film formation, and are to be blocked up after the removal of the sacrificial layers are formed in the inner inorganic sealing film 21 by photolithography processing or the like as shown in FIG. 7. Particularly, when the opening shape sections 21a are arranged two-dimensionally in a plane including a part directly above the micromachine serving as a functional element, it is possible to complete etching within a short period of time when the sacrificial layers 18 and 19 are removed.

Subsequently, an etching agent for removing the sacrificial layers is introduced from the opening shape sections 21a, and all the sacrificial layers 18 and 19 are completely removed. For example, by introducing gaseous $XeF_2$ for selectively removing polycrystalline silicon from the opening shape sections 21a, all the sacrificial layers are removed. As a result of this, the hollow section 17 is formed inside the inner inorganic sealing film 21.

After the sacrificial layers 18 and 19 are removed, the micromechanical device 1 is left as it is in the atmospheric state. As a result of this, the hollow section 17 communicating with the outside through the opening shape sections 21a has an internal pressure of about 0.1 Mpa which is close to the atmospheric pressure. Accordingly, the fluid resistance inside the hollow section 17 is larger than in the case of a vacuum. Besides, it is also possible to make the inside of the hollow section 17 communicating with the outside through the opening shape sections 21a a nitrogen atmosphere by, for example, exposing the micromechanical device 1 to a nitrogen atmosphere after the removal of the sacrificial layers.

Then, in the normal pressure state, resin sealing is performed by forming the organic sealing film 22 under a condition of, for example, pressure of 0.1 Mpa (atmospheric pressure). A UV curing resin is applied by using a screen printing method in a thickness sufficient to bury the opening shape sections 21a therein. For example, a mask having a predetermined shape is formed, a UV curing resin is squeezed, thereafter the mask is removed, and the UV curing resin is applied to the predetermined part. After this, the UV curing resin is irradiated with ultraviolet light, thereby curing the UV curing resin. Viscosity of about 100 to 400 Pa·s is suitable for the UV curing resin and, for example, a photo-curing resin (XNR-5516) manufactured by Nagase Chemtex Corporation is used.

As a result of the above, the opening shape sections 21a are blocked up, and the MEMS element 16 is airtightly sealed through the hollow section 17. If the screen-printing, and the UV curing are performed in an inert gaseous atmosphere of $N_2$, a sealed structure filled with $N_2$ is obtained.

Then, the micromechanical device 1 is put into a thin film deposition system chamber having a high degree of vacuum, thereby forming the outer inorganic sealing film 23. A film of SiN having low moisture permeability is formed to cover the organic sealing film 22 in a thickness of, for example, 0.5 to 1 μm by using, for example, a plasma-enhanced CVD system or a sputtering system, thereby forming the outer inorganic sealing film 23.

As a result of the above, the micromechanical device 1 shown in FIG. 1 is completed. The package as the micromechanical device 1 configured in the manner described above can be used for, for example, a driver IC chip, a high-frequency variable capacitor chip, and the like.

The micromechanical device 1, and the method of manufacturing the micromechanical device 1 according to this embodiment exhibit the effects described below. That is, by making the atmosphere of the hollow section 17 an atmosphere having higher pressure than the inside of the thin film deposition system chamber, it is possible to increase the fluid resistance, and suppress the vibration of the MEMS element 16. For example, it is possible to make the attenuation factor of the vibration at the center of the beam-like part shown in FIG. 2 three times as large as that of the hollow sealing structure in the case of a vacuum. Accordingly, it is possible to suppress noise in the output signal, and improve the accuracy as a component.

Further, coating of the organic sealing film 22 constituted of, for example, the UV curing resin is provided, and hence the viscosity of the resin is high, and the resin can be prevented from being deposited under the opening shape sections 21a at the time of the film formation. Accordingly, the arrangement of the opening shape sections 21a is not limited, and it is possible to provide the opening shape sections 21a in the entire region of the top surface of the inner inorganic sealing film 21 such as a part directly above the MEMS element 16. Accordingly, it is possible to shorten the time required to completely remove the sacrificial layers. That is, in a micromechanical device in which the second sealing body is deposited under the opening shape sections, the opening shape sections need to be provided at positions separate from the micromachine, and hence there is no opening shape sections near the center of the sealing body at which the element is positioned, and it takes much time to completely remove the sacrificial layers. However, in this embodiment, the opening shape sections 21a can be provided above the MEMS element 16, and it is therefore possible to shorten the time required to remove the sacrificial layers inside.

Further, the sealing body 20 is constituted of a material having insulation characteristics such as $SiO_2$, and SiN, and hence no capacitance is formed between the body 20 and the MEMS element 16 having conductivity. Accordingly, it is possible to realize performance having a large change of capacitance in an electromechanical component which is to be used as a variable capacitor, and in which capacitance formation is avoided between the MEMS element 16 and surrounding conductive members.

Incidentally, the present invention is not limited to the embodiment described above, and the material, shape, arrangement, size, structure/operation, and the like of each constituent element can be appropriately changed and implemented. For example, the MEMS element 16 may have a cantilever beam-like shape. Further, examples of the patterning method, and the method of removing the sacrificial layers include dry etching using an etching gas, and wet etching using a chemical solution. Further, the plural sacrificial layers may not be the same. Further, although the structure in which the substrate includes the base substrate 11 provided with the insulating layer 12 thereon has been described above, the insulating layer 12 may be omitted, the substrate may be constituted of only the base substrate 11, and the MEMS element 16, and the signal interconnect 15 may be formed on the base substrate 11.

Although the case where the screen printing method is used for film formation has been exemplified, other methods such as spin coating, and the like may also be used.

In addition to the above, the constituent elements of the present invention can be modified and embodied in the implementation stage within the scope not deviating from the gist of the invention. Further, by combining a plurality of constituent elements disclosed in the embodiment described above with each other, various inventions can be formed. For example, some constituent elements may be deleted from all the constituent elements shown in the embodiment. Further, constituent elements of different embodiments may be appropriately combined with each other.

Second Embodiment

Next, the configuration of a micromechanical device 2 according to a second embodiment of the present invention will be described below with reference to FIG. 13. Incidentally, in the figures, the configuration is schematically shown by appropriately enlarging, reducing, and omitting the configuration. This embodiment is identical with the first embodiment described above except that a wide section 20b, and a constriction section 20f are formed in a close adhesion section 20a, and hence a detailed description thereof will be omitted.

FIG. 13 shows a case where a separate sealing body 20 is formed on each of two micromechanical devices 1 arranged side by side on a substrate 11, and a hollow section 17 is formed inside each device 1 to thereby seal a MEMS element 16 therein.

Each of two sealing structures 20 constituting the hollow sections 17 includes an inner inorganic sealing film 21 formed on the substrate 11, an organic sealing film 22, and an outer inorganic sealing film 23 positioned outside, and having low moisture permeability.

The inner inorganic sealing film 21 is provided with opening sections 21a for introducing a gas for etching sacrificial layers which will become the hollow section 17 by being removed.

The external shape of the hollow sealing structure forms an octagonal shape long in one direction in a plan view. The close adhesion section 20a is formed on the outer edge of the hollow sealing structure, and a MEMS element 16 is surrounded by the close adhesion section 20a. The edge on the outside of the hollow section is shown as an outer edge 20d, and the edge on the inside of the hollow section is shown as an inner edge 20e.

In the close adhesion section 20a which is formed between the outer edge 20d and the inner edge 20e, and closely adheres to the substrate 11, the plurality of the wide sections 20b having a width formed locally wide are formed in the longitudinal direction. That is, the constriction sections 20f in which the inner edge 20e is bent toward the inside of the hollow section in such a manner that the distance between the outer edge 20d and the inner edge 20e is locally prolonged are formed. In the close adhesion section 20a, the parts having a narrow width other than the wide sections 20b are named the narrow sections 20g. That is, the close adhesion section 20a is configured to include the narrow sections 20g having a small width, and the wide sections 20b having a width larger than the narrow sections 20g.

It is desirable that the wide sections 20b be arranged at positions that minimize the volume of the hollow section in accordance with, for example, the shape or the like of the MEMS element 16 sealed inside the hollow section. In this embodiment, the constriction sections 20f are arranged in such a manner that the MEMS element 16 corresponds to the parts configured to have a smaller width.

Further, the wide sections 20b positioned between the two parallel sealing bodies 20 are arranged in such a manner that their positions match with each other, and opposition sections 20c at which the wide sections 20b are opposed to each other are formed between the hollow sections 17. In this opposition section 20c, the close adhesion section 20a is particularly widened, and hence the degree of close adhesion is enhanced.

In other words, a wall-shaped section 20h extends upward from the substrate 11 between the two MEMS elements 16 formed of the sealing bodies 20 on the substrate 11, and divides the two MEMS elements 16 by hermetic sealing. The close adhesion section 20a between the wall-shaped section 20h and the substrate 11 has wide sections 20b and narrow sections 20g. Therefore, even if one of the sealing bodies 20 is broken, the other sealing body 20 is kept hermetic. The wall-shaped section 20h functions as a support member necessary to maintain the structure of the inner sealing film 21, which has been upsized because of a plurality of micromachines provided therein.

According to the micromechanical device 2 of this embodiment, the external shape of the inner inorganic sealing film 21 includes the wide sections 20b, whereby even when the distance between the sealing films is made small for the purpose of reducing the size, it is possible to secure the close adhesion area in which the inner sealing film and the substrate closely adhere to each other by means of the wide sections 20b. This makes it possible to prevent the inorganic film and the substrate from peeling off each other even when a load such as a heating process is caused.

As shown in FIG. 14, in an ordinary configuration in which the width of the close adhesion section 20a is constant, and neither the wide sections 20b nor the constriction sections 20f are provided, when the distance between the hollow sections 17 is made smaller, and the hollow sections 17 are made closer to each other to be arranged, the area of the close adhesion section 20a becomes smaller as a whole. Thus, when a peeling-off strain is caused by the thermal expansion of the organic sealing film 22 incidental to the heating in the package assembly process, exfoliation is liable to occur at the close adhesion section. Conversely, in this embodiment, the adhesion strength is secured by the wide sections 20b, and the exfoliation can therefore be prevented.

That is, in order to make the setting area of each micromechanical device 2 small, and reduce the size, the sealing structure bodies 20 are arranged closer to each other so as to shorten the distance between the hollow sections 17. However, by providing the wide sections 20b, it is possible to make the adhesion strength and the reduction in size compatible with each other. Accordingly, the micromechanical device 2 according to this embodiment can realize a micromechanical device having a hollow sealing structure body which is hardly broken by the load in the treatment process.

Further, in this embodiment having the wide sections 20b, it is possible to, when the distance between the hollow sections 17 is all the same, reduce the amount of the sacrificial layer. Therefore, the effect of shortening the time required to etch the sacrificial layer, and improving the productivity can also be obtained.

Incidentally, in this embodiment, the case of the three-layered structure has been described. However, the embodiment is not limited to this, when the wide sections 20b are formed in the close adhesion section 20a, the above effect can be obtained.

Third Embodiment

Next, the configuration of a micromechanical device 3 according to a third embodiment of the present invention will be described below with reference to FIGS. 15 to 18. Incidentally, in the figures, the configuration is schematically shown by appropriately enlarging, reducing, and omitting the configuration. This embodiment is identical with the first embodiment described above except for the fact that an outer peripheral wall section 22a of an organic sealing film 22 constituting the sealing body 20 is formed thin, and hence a detailed description thereof will be omitted.

A two-stage sealing structure 20 constituting a hollow section 17 includes an inner inorganic sealing film 21 formed on a substrate 11, an organic sealing film 22, and an outer inorganic sealing film 23 positioned outside, and having low moisture permeability. The external shape of the sealing body 20 forms an octagonal shape long in one direction in a plan view.

The inner inorganic sealing film 21 is provided with opening sections 21a for introducing a gas for etching sacrificial layers which will become the hollow section 17 by being removed.

Further, the inner inorganic sealing film 21 includes a close adhesion section 21b as an outer edge section closely adhering to the substrate, an outer peripheral wall section 21c as an outer peripheral section surrounding the outer peripheral part of a MEMS element 16, and rising from an inner edge of the close adhesion section 21b, and an upper wall section 21d as a central section covering a part above the MEMS element 16, and is formed into a dome-like shape. A corner section 21e having a curved surface is formed on the outer peripheral wall section 21c.

The organic sealing film 22 includes an outer peripheral wall section 22a covering the outer peripheral wall section 21c, and an upper wall section 22b covering the upper wall section 21d, and is formed into a dome-like shape.

The outer inorganic sealing film 23 includes an outer edge section 23a covering the close adhesion section 21b, an outer peripheral wall section 23b covering the outer peripheral wall section 22a, and an upper wall section 23c covering the upper wall section 22b, and is formed into a dome-like shape.

The outer peripheral part of the organic sealing film 22 is formed into a thin-walled shape. In the organic sealing film 22, the outer peripheral wall section 22a which is a part covering the outer peripheral wall section 21c is formed thinner than the upper wall section 22b which is a part covering the upper wall section 21d.

The organic sealing film 22 has no part covering the close adhesion section 21b, and the outer peripheral wall section 22a is formed thinner as compared with the normal configuration shown in FIGS. 19 to 22, whereby the volume of the organic sealing film 22 at the end section of the sealing body 20 becomes small. That is, the organic sealing film 22 positioned directly under the outer inorganic sealing film 23 having low moisture permeability at the outer peripheral end section of the sealing body 20 is made thin.

As for this shape, for example, when the organic sealing film 22 is formed by spin coating, it is possible to form the organic sealing film 22 thin by performing patterning using a photoresist, and by making the shape thereof similar to the hollow section 17. It is desirable that the thickness of the organic sealing film 22 be about 3 μm.

Figure 17:
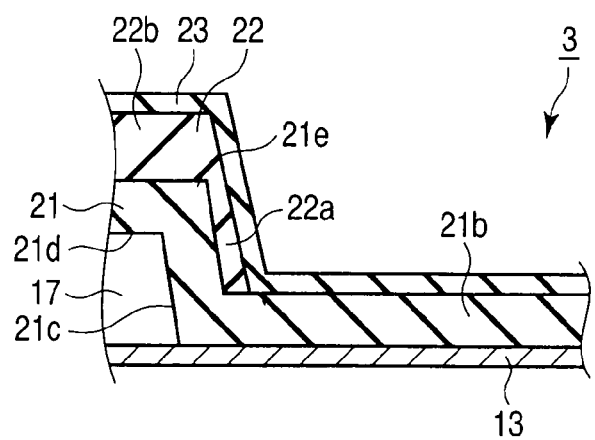
FIG. 17 is a cross-sectional view showing a state of the micromechanical device before a sealing body is deformed.
Figure 21:
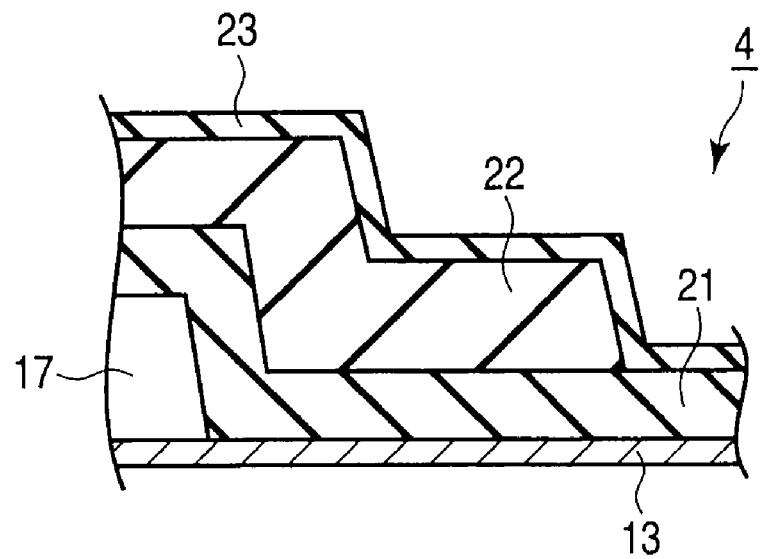
FIG. 21 is a cross-sectional view showing a state of the micromechanical device before a sealing body is deformed.

The outer inorganic sealing film 23 having low moisture permeability is formed by a film formation method such as CVD, sputtering, and the like at a high temperature (250° C. or higher). For this reason, after the outer inorganic sealing film 23 is formed, when the temperature is returned to the normal temperature, the organic sealing film 22 contracts. FIGS. 17 and 18 show the states before and after the deformation, respectively. In the micromechanical device 3 according to this embodiment, the contraction volume of the organic sealing film 22 is made small, and the deformation resulting from a temperature change is kept low by forming the organic sealing film 22 of the corner section 21e thin.

The micromechanical device 3 according to this embodiment can realize a micromechanical device having a hollow sealing structure body which is hardly broken by the load in the treatment process by keeping the contraction of the organic sealing film 22 resulting from the temperature change to a minimum.

It is possible to efficiently prevent deformation from occurring, and prevent breakage from occurring without degrading the sealing performance at the upper part by making the organic sealing film 22 thin at only the end part and the outer peripheral part thereof at which a difference between the film 22 and the outer inorganic sealing film 23 in deformation is liable to occur.

Figure 22:
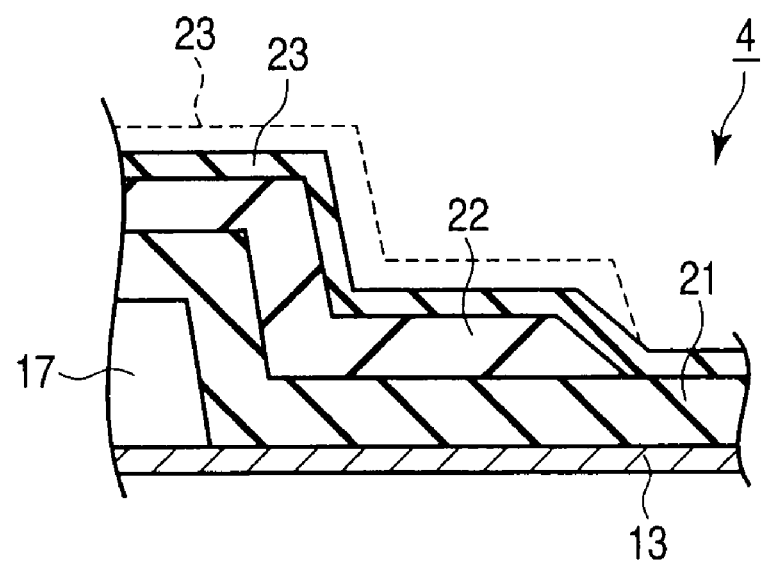
FIG. 22 is a cross-sectional view showing a state of the micromechanical device after the sealing body is deformed.

The state of the micromechanical device 3 according to this embodiment after the deformation is shown in FIG. 18, and the state of the micromechanical device of the case where the normal organic sealing film 22 is formed thick after the deformation is shown in FIG. 22.

In a micromechanical device 4 having the normal configuration shown in FIGS. 19 to 22, deformation occurs at the end part by the contraction of the organic sealing film 22 in such a manner that the outer peripheral wall section 22d lies down to make the rising angle smaller. The angular change of the outer inorganic sealing film 23 having low moisture permeability rising from the substrate at the end part is large.

On the other hand, as shown in FIGS. 17 and 18, in the organic sealing film 22 of this embodiment, the end part is formed thin, and hence deformation incidental to the contraction is small, and the angular change of the outer inorganic sealing film 23 having low moisture permeability rising from the substrate at the end part is small. Accordingly, it can be seen about the structure that at the time of the low temperature after the formation of the outer inorganic sealing film 23 having low moisture permeability, deformation at the end part is small, and breakage hardly occurs.

In the second embodiment, the wall-shaped section 20h is described as a structure which hermetically divides the hollow sections. However, since the wall-shaped section 20h is a support to maintain the structure of the sealing film, it does not necessarily have a hermetic structure. In the case where the wall-shaped section 20h is constructed to hermetically isolate one hollow section containing one micromachine from the other hollow section containing another micromachine, it is possible to prevent a break of hermeticity in one hollow section from influencing the other hollow section. Therefore, it is preferable that the wall-shaped section has a structure to hermetically isolate the hollow portions from each other. With this configuration, the structural strength as the support can be increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A micromechanical device comprising:
a substrate;
a micromachine which is mounted on the substrate, is provided with a mechanism deformed by a function of an electric field, and changes the electrical characteristics concomitantly with the deformation;
an inner inorganic sealing film which contains an inorganic material, is provided on a principal surface of the substrate, covers the micromachine through a hollow section containing a gaseous body therein, and is provided with opening shape sections allowing the hollow section to communicate with the outside;
an organic sealing film which contains an organic material, is formed on the inner inorganic sealing film, and blocks up the opening shape sections; and
an outer inorganic sealing film which contains an inorganic material with lower moisture permeability than the organic material, is formed on the organic sealing film, and covers the organic sealing film.

2. The micromechanical device according to claim 1, wherein the inside of the hollow section is an inert gaseous atmosphere.

3. The micromechanical device according to claim 1, wherein the inside of the hollow section is the atmosphere.

4. The micromechanical device according to claim 1, wherein in that the organic sealing film is constituted of a photocuring resin.

5. The micromechanical device according to claim 1, wherein the outer inorganic sealing film is constituted of a material containing SiN.

6. A micromechanical device comprising:
a substrate;
a micromachine which is mounted on the substrate, is provided with a mechanism deformed by a function of an electric field, and changes the electrical characteristics concomitantly with the deformation;
an inner sealing film which is provided on a principal surface of the substrate, covers the micromachine through a hollow section containing a gaseous body therein, and is provided with opening shape sections allowing the hollow section to communicate with the outside; and
an outer sealing film which is formed on the inner sealing film, and blocks up the opening shape sections, wherein
a close adhesion section at which the inner sealing film surrounding an outer periphery of the micromachine, and the principal surface of the substrate closely adhere to each other includes a narrow section, and a wide section width of which is formed wider than the narrow section.

7. The micromechanical device according to claim 6, further comprising:
   at least one more micromachine arranged on the substrate in addition to said micromachine; and
   a wall-shaped section which extends from the substrate between the micromachines and divides the micromachines,
   wherein the close adhesion section between the wall-shaped section and the substrate includes a narrow section, and a wide section width of which is formed wider than the narrow section.

8. The micromechanical device according to claim 6, wherein the micromachine includes narrow part narrowed toward the center side, and the wide section is arranged in such a manner that the wide section is opposed to the narrow part of the micromachine.

9. The micromechanical device according to claim 1, wherein
   an outer edge section of the inner inorganic sealing film is provided on a principal surface of the substrate,
   a central section of the inner inorganic sealing film covers the micromachine through a hollow section containing a gaseous body therein, and
   in the organic sealing film, a part thereof covering an outer peripheral section of the inner inorganic sealing film rising from the outer edge section is formed thinner than a part thereof covering the central section of the inner inorganic sealing film.

* * * * *